(12) United States Patent
Reis et al.

(10) Patent No.: US 7,889,502 B1
(45) Date of Patent: Feb. 15, 2011

(54) HEAT SPREADING CIRCUIT ASSEMBLY

(75) Inventors: Bradley E. Reis, Westlake, OH (US);
James R. Cartiglia, Brentwood, TN (US)

(73) Assignee: GrafTech International Holdings Inc., Parma, OH (US)

( * ) Notice: Subject to any disclaimer, the term of this patent is extended or adjusted under 35 U.S.C. 154(b) by 277 days.

(21) Appl. No.: 11/267,933

(22) Filed: Nov. 4, 2005

(51) Int. Cl.
*H05K 7/20* (2006.01)
(52) U.S. Cl. .................... 361/717; 361/703; 361/719; 165/80.3; 174/16.3; 428/195.1
(58) Field of Classification Search ................ 361/710, 361/719, 703, 707, 717; 165/80.3, 185, 46, 165/172; 257/13–14, 79; 174/16.3; 428/195.1
See application file for complete search history.

(56) References Cited

U.S. PATENT DOCUMENTS

| | | | | |
|---|---|---|---|---|
| 3,404,061 A | | 10/1968 | Shane et al. ................ 161/125 |
| 3,678,995 A | | 7/1972 | Collard ....................... 165/185 |
| 4,234,638 A | | 11/1980 | Yamazoe et al. ............ 428/133 |
| 4,739,448 A | * | 4/1988 | Rowe et al. ................. 361/719 |
| 4,782,893 A | | 11/1988 | Thomas ...................... 165/185 |
| 4,812,792 A | | 3/1989 | Leibowitz ................... 333/238 |
| 4,878,152 A | | 10/1989 | Sauzade et al. ............. 361/386 |
| 4,895,713 A | | 1/1990 | Greinke et al. .............. 423/448 |
| 4,961,991 A | | 10/1990 | Howard ...................... 428/246 |
| 5,192,605 A | | 3/1993 | Mercuri et al. .............. 428/224 |
| 5,224,030 A | | 6/1993 | Banks et al. ................ 361/386 |
| 5,255,738 A | | 10/1993 | Przilas ....................... 165/185 |
| 5,287,248 A | | 2/1994 | Montesano ................. 361/708 |
| 5,316,080 A | | 5/1994 | Banks et al. ................ 165/185 |
| 5,366,688 A | | 11/1994 | Terpstra et al. ............... 419/36 |
| 5,461,201 A | * | 10/1995 | Schonberger et al. ...... 174/16.3 |
| 5,509,993 A | | 4/1996 | Hirschvogel ............... 156/326 |
| 5,542,471 A | * | 8/1996 | Dickinson .................. 165/170 |
| 5,660,917 A | * | 8/1997 | Fujimori et al. .......... 428/195.1 |
| 5,902,762 A | | 5/1999 | Mercuri et al. ................ 501/99 |
| 5,944,097 A | * | 8/1999 | Gungor et al. .............. 165/185 |
| 5,958,572 A | | 9/1999 | Schmidt et al. ............. 428/320 |
| 6,027,807 A | | 2/2000 | Inoue et al. ................. 428/408 |
| 6,060,166 A | * | 5/2000 | Hoover et al. .............. 428/408 |
| 6,075,701 A | | 6/2000 | Ali et al. ..................... 361/704 |
| 6,131,651 A | | 10/2000 | Richey, III ................. 165/185 |
| 6,141,216 A | | 10/2000 | Holung et al. .............. 361/687 |
| 6,147,869 A | * | 11/2000 | Furnival ..................... 361/719 |
| 6,208,513 B1 | | 3/2001 | Fitch et al. .................. 361/704 |
| 6,278,613 B1 | * | 8/2001 | Fernandez et al. .......... 361/719 |
| 6,362,964 B1 | * | 3/2002 | Dubhashi et al. ........... 361/707 |
| 6,503,626 B1 | | 1/2003 | Norley et al. ............... 428/408 |

(Continued)

OTHER PUBLICATIONS

PCT/US02/39749 Published Jun. 26, 2003, WO 03/051772.

(Continued)

*Primary Examiner*—Jayprakash N Gandhi
*Assistant Examiner*—Courtney Smith
(74) *Attorney, Agent, or Firm*—Waddey & Patterson, P.C.; James R. Cartiglia (57) ABSTRACT

A circuit assembly including a substrate which has a dielectric layer, a heat spreader layer located at a first surface of the substrate, a heat generating component located at a second surface of the substrate, and a thermal pathway in thermal connection between the heat spreader layer and the heat generating component.

36 Claims, 3 Drawing Sheets

U.S. PATENT DOCUMENTS

| | | | |
|---|---|---|---|
| 6,538,892 B2 | 3/2003 | Smalc | 361/710 |
| 6,555,223 B2 | 4/2003 | Kubo | 428/408 |
| 6,673,289 B2 | 1/2004 | Reynolds, III et al. | 264/115 |
| 6,706,400 B2 | 3/2004 | Mercuri et al. | 428/408 |
| 6,749,010 B2 * | 6/2004 | Getz, Jr. et al. | 165/80.3 |
| 6,758,263 B2 | 7/2004 | Krassowski et al. | 165/185 |
| 6,771,502 B2 * | 8/2004 | Getz, Jr. et al. | 361/703 |
| 6,886,249 B2 | 5/2005 | Smalc | 29/890.03 |
| 6,930,885 B2 | 8/2005 | Barcley | 361/719 |
| 7,077,858 B2 * | 7/2006 | Fletcher et al. | 607/104 |
| 7,102,172 B2 * | 9/2006 | Lynch et al. | 257/79 |
| 7,176,502 B2 * | 2/2007 | Mazzochette et al. | 257/99 |
| 7,303,005 B2 * | 12/2007 | Reis et al. | 165/185 |
| 2002/0157819 A1 | 10/2002 | Norley et al. | |
| 2003/0019104 A1 | 1/2003 | Smalc | |
| 2003/0098651 A1 | 5/2003 | Lin et al. | |
| 2003/0116312 A1 | 6/2003 | Krassowski et al. | |
| 2005/0116235 A1 * | 6/2005 | Schultz et al. | 257/79 |
| 2005/0161682 A1 * | 7/2005 | Mazzochette et al. | 257/79 |
| 2006/0191675 A1 * | 8/2006 | Fletcher et al. | 165/172 |
| 2007/0102142 A1 * | 5/2007 | Reis et al. | 165/80.3 |

OTHER PUBLICATIONS

European Patent Application No. 95104171.4, Publication No. 0673900, filed Mar. 22, 1995.

Exhibit "A"—webpage for Radian Heatsinks—Standard Heatsink Products.

Exhibit "B"—webpage for Arkua Cooler; Special Design for Intel P4 Socket 423/478; Intel PIII PGA 370; AMD Socket 462.

* cited by examiner

HEAT SPREADING CIRCUIT ASSEMBLY

TECHNICAL FIELD

The present invention relates to a circuit assembly having improved heat spreading capabilities. The inventive circuit assembly includes a heat source, such as a light emitting diode (LED) disposed on a circuit assembly substrate, a heat spreader layer disposed on the circuit assembly substrate and a thermal pathway between the heat generating component and the heat spreader layer.

BACKGROUND OF THE INVENTION

Printed circuit boards are conventionally manufactured from dielectric materials such as glass fiber laminates (known as FR4 boards), polytetrafluoroethylene, and like materials. On one of the surfaces of such boards, or between layers of dielectric materials, are circuits, usually formed of copper. The circuits are commonly formed by photolithographic methods, sputtering, screen printing or the like (for circuits disposed between layers, the circuit is applied to the dielectric material before formation of the laminate). In addition, components such as LEDs, processors, or the like can be disposed on the surface of the boards, in contact with the circuits on the surface. Such components can generate substantial amounts of heat that must be dissipated for them to operate reliably and to their intended performance levels As a result of these heat generating components, the amount of heat that print circuit boards must help dissipate can be significant. So called "thermal boards" are being developed where a layer of a heat spreading material such as copper or aluminum and alloys thereof is laminated with the dielectric material, on the surface opposite or in layers opposing that of the circuit and heat-generating components, to act as a heat spreader for the heat generated from the electronic components. It is important that the heat spreader be located such that at least one layer of dielectric material separates the heat spreader from the circuit(s), since the heat spreader materials are typically electrically conductive, and would interfere with the operation of the circuits if they were in contact.

There are several commercially available "thermal boards," sometimes called metal core printed circuit boards (MCPCB), such as Insulated Metal Substrate™ thermal boards from The Bergquist Company, T-Clad™ thermal boards from Thermagon, HITT Plate boards from Denka, and Anotherm™ boards from TT Electronics. These thermal boards utilize thermally conductive dielectric layers, either through filling the dielectric layer with thermally conductive particles as in the case of the first three, or as in the case of the Anotherm solution, through a thin anodization layer on top of the aluminum heat spreader layer. The use of thermally conductive particles can be expensive, however, and the subsequent layer must be thick enough to ensure it is pin-hole free, adding to thermal resistance in the design. Additional limitations of this approach arise from the lack of flexibility to fabricate bent or non-planar circuit structures, and the fact that the dielectric material covers the entire surface of the heat spreader layer. The use of anodization as the dielectric layer attempts to overcome some of these issues, but forces the use of aluminum as its heat spreader layer, since copper cannot be anodized. Since the thermal conductivity of aluminum is significantly less than that of copper, this can be a thermal disadvantage. All of the foregoing approaches, however, can suffer soldering difficulties, since the same heat dissipation properties that are useful during the operation of the printed circuit board and components, inhibit an assembly process that requires point sources of heat for soldering (such as hot bar bonding, for example).

To overcome some, but not all of these issues, traditional printed circuit boards can be married to a separate metal heat spreader layer in a separate process. In this arrangement, the printed circuit board can be designed with thermal vias (typically drilled holes that are plated with copper) to conduct heat better through the unfilled dielectric layer of the printed circuit board, but these may only be used in applications where electrical isolation from component to component is not required.

Moreover, traditional heat spreading materials like copper or aluminum also add significant weight to the board, which is undesirable, and the coefficient of thermal expansion (CTE) of these materials may not closely match that of the glass fiber laminate, leading to physical stress on the printed circuit board with the application of heat and, potentially, delamination or cracking.

Additionally, since the heat spreader layer on these boards is comprised of an isotropic, thin (relative to its length and width) metal material, heat tends to flow through the thickness of the heat spreader readily, and resulting hot-spots can occur in the location directly opposite the heat source.

Another type of circuit assembly, referred to in the industry as a "flex circuit," provides similar heat management problems. Flex circuits are formed by providing a circuit, such as a copper circuit as described above, on the surface of a polymer material, such as a polyimide or polyester, which functions as the dielectric layer. As the name suggests, these circuit materials are flexible and can even be provided as rolls of circuit materials that can later be married to a heat spreader layer like copper or aluminum. While very thin, the dielectric layer in flex circuits still adds appreciably to the thermal resistance in a given design, and suffers from some of the same issues observed in printed circuit boards. The use of thermal vias is still limited to electrically isolating applications as described previously. And as is apparent, the use of rigid metallic layers, such as of copper or aluminum, does not allow one to take advantage of the flexibility of flex circuits, where such a characteristic is important in an end-use application.

The use of a heat spreader formed of sheet(s) of compressed particles of exfoliated graphite can remedy many of the disadvantages encountered with the use of copper or aluminum heat spreaders, since such graphite materials provide the advantage of an 80% weight reduction compared to copper, while being able to match or even exceed the thermal conductivity of copper in the in-plane direction needed for heat spreading across the surface of a printed circuit board. In addition, graphite also has a closer CTE match to the glass fiber laminate, so undesirable CTE mismatch stresses will be reduced.

While sheets of compressed particles of exfoliated graphite can even have the flexibility for use with flex circuits, the addition of a graphite-based heat spreader layer cannot counter all of the disadvantages arising from the location of a heat spreader such that one or more layers of dielectric material separate the heat spreader from the heat-generating components, with the reduced heat transfer from the components to the heat spreader layer.

Laminates in which one or more of the layers consist of flexible graphite sheets are known in the art. These structures find utility, for example, in gasket manufacture. See U.S. Pat. No. 4,961,991 to Howard. Howard discloses various laminate structures which contain metal or plastic sheets, bonded between sheets of flexible graphite. Howard discloses that such structures can be prepared by cold-working a flexible graphite sheet on both sides of a metal net and then press-adhering the graphite to the metal net. Howard also discloses placing a polymer resin coated cloth between two sheets of flexible graphite while heating to a temperature sufficient to soften the polymer resin, thereby bonding the polymer resin coated cloth between the two sheets of flexible graphite to produce a flexible graphite laminate. Similarly, Hirschvogel, U.S. Pat. No. 5,509,993, discloses flexible graphite/metal laminates prepared by a process which involves as a first step applying a surface active agent to one of the surfaces to be bonded. Mercuri, U.S. Pat. No. 5,192,605, also forms laminates from flexible graphite sheets bonded to a core material which may be metal, fiberglass or carbon. Mercuri deposits and then cures a coating of an epoxy resin and particles of a thermoplastic agent on the core material before feeding core material and flexible graphite through calender rolls to form the laminate.

In addition to their utility in gasket materials, graphite laminates also find utility as heat transfer or cooling apparatus. The use of various solid structures as heat transporters is known in the art. For example, Banks, U.S. Pat. Nos. 5,316,080 and 5,224,030 discloses the utility of diamonds and gas-derived graphite fibers, joined with a suitable binder, as heat transfer devices. Such devices are employed to passively conduct heat from a source, such as a semiconductor, to a heat sink.

In U.S. Pat. No. 6,758,263, Krassowski and Chen disclose the incorporation of a high conducting insert into a heat dissipating component such as a graphite heat sink base in order to conduct heat from a heat source through the thickness of the component, and from there in a planar direction. However, nothing in the Krassowski and Chen disclosure describes conducting heat from a heat source through layers of a relatively non-conductive material like a dielectric layer of a circuit assembly.

As noted, the graphite material preferred for use as the heat spreader material of this invention is sheets of compressed particles of exfoliated graphite, typically referred to as flexible graphite sheet material.

The following is a brief description of graphite and the manner in which it is typically processed to form flexible graphite sheet materials. Graphite, on a microscopic scale, is made up of layer planes of hexagonal arrays or networks of carbon atoms. These layer planes of hexagonally arranged carbon atoms are substantially flat and are oriented or ordered so as to be substantially parallel and equidistant to one another. The substantially-flat, parallel, equidistant sheets or layers of carbon atoms, usually referred to as graphene layers or basal planes, are linked or bonded together and groups thereof are arranged in crystallites. Highly-ordered graphite materials consist of crystallites of considerable size, the crystallites being highly aligned or oriented with respect to each other and having well ordered carbon layers. In other words, highly ordered graphites have a high degree of preferred crystallite orientation. It should be noted that graphites, by definition, possess anisotropic structures and thus exhibit or possess many characteristics that are highly directional, e.g., thermal and electrical conductivity and fluid diffusion.

Briefly, graphites may be characterized as laminated structures of carbon, that is, structures consisting of superposed layers or laminae of carbon atoms joined together by weak van der Waals forces. In considering the graphite structure, two axes or directions are usually noted, to with, the "c" axis or direction and the "a" axes or directions. For simplicity, the "c" axis or direction may be considered as the direction perpendicular to the carbon layers. The "a" axes or directions may be considered as the directions parallel to the carbon layers or the directions perpendicular to the "c" direction. The graphites suitable for manufacturing flexible graphite sheets possess a very high degree of orientation.

As noted above, the bonding forces holding the parallel layers of carbon atoms together are only weak van der Waals forces. Natural graphites can be chemically treated so that the spacing between the superposed carbon layers or laminae can be appreciably opened up so as to provide a marked expansion in the direction perpendicular to the layers, that is, in the "c" direction, and thus form an expanded or intumesced graphite structure in which the laminar character of the carbon layers is substantially retained.

Graphite flake which has been chemically or thermally expanded and more particularly expanded so as to have a final thickness or "c" direction dimension which is as much as about 80 or more times the original "c" direction dimension, can be formed without the use of a binder into cohesive or integrated sheets of expanded graphite, e.g. webs, papers, strips, tapes, or the like (typically referred to as "flexible graphite"). The formation of graphite particles which have been expanded to have a final thickness or "c" dimension which is as much as about 80 times or more the original "c" direction dimension into integrated flexible sheets by compression, without the use of any binding material, is believed to be possible due to the mechanical interlocking, or cohesion, which is achieved between the voluminously expanded graphite particles.

In addition to flexibility, the sheet material, as noted above, has also been found to possess a high degree of anisotropy to thermal and electrical conductivity and fluid diffusion, somewhat less, but comparable to the natural graphite starting material due to orientation of the expanded graphite particles substantially parallel to the opposed faces of the sheet resulting from very high compression, e.g. roll processing. Sheet material thus produced has excellent flexibility, good strength and a very high degree or orientation. There is a need for processing that more fully takes advantage of these properties.

Briefly, the process of producing flexible, binderless anisotropic graphite sheet material, e.g. web, paper, strip, tape, foil, mat, or the like, comprises compressing or compacting under a predetermined load and in the absence of a binder, expanded graphite particles which have a "c" direction dimension which is as much as about 80 or more times that of the original particles so as to form a substantially flat, flexible, integrated graphite sheet. The expanded graphite particles that generally are worm-like or vermiform in appearance will, once compressed, maintain the compression set and alignment with the opposed major surfaces of the sheet. Properties of the sheets may be altered by coatings and/or the addition of binders or additives prior to the compression step. See U.S. Pat. No. 3,404,061 to Shane, et al. The density and thickness of the sheet material can be varied by controlling the degree of compression.

Lower densities are advantageous where surface detail requires embossing or molding, and lower densities aid in achieving good detail. However, higher in-plane strength and thermal conductivity are generally favored by more dense sheets. Typically, the density of the sheet material will be within the range of from about 0.04 g/cm$^3$ to about 1.4 g/cm$^3$.

Flexible graphite sheet material made as described above typically exhibits an appreciable degree of anisotropy due to the alignment of graphite particles parallel to the major opposed, parallel surfaces of the sheet, with the degree of anisotropy increasing upon roll pressing of the sheet material to increased density. In roll-pressed anisotropic sheet material, the thickness, i.e. the direction perpendicular to the opposed, parallel sheet surfaces comprises the "c" direction and the directions ranging along the length and width, i.e. along or parallel to the opposed, major surfaces comprises the "a" directions and the thermal properties of the sheet are very different, by orders of magnitude typically, for the "c" and "a" directions.

SUMMARY OF THE INVENTION

It is an object of the invention to provide a circuit assembly having improved heat spreading capabilities.

It is a further object of the invention to provide a circuit assembly having a heat spreader layer on one surface thereof and a thermal pathway for heat from a heat-generating component located at the other surface thereof to flow towards the heat spreader layer.

It is yet another object of this invention to provide a circuit assembly having a heat spreader layer on one surface thereof and a thermal pathway for heat from a heat-generating component located at the other surface thereof, where the heat spreader layer comprises one or more sheets of compressed particles of exfoliated graphite.

It is still another object of the invention to provide a thermal pathway across a dielectric material interposed between a heat-generating component and a graphite-based heat spreader layer in a circuit assembly.

These and other objects are accomplished by the present invention, which provides a circuit assembly comprising at least one layer of a dielectric material positioned between a heat spreader layer and a heat-generating component, wherein a thermal pathway is formed between the heat-generating component and the heat spreader layer.

Other and further objects, features, and advantages of the present invention will be readily apparent to those skilled in the art, upon a reading of the following disclosure when taken in conjunction with the accompanying drawings.

DETAILED DESCRIPTION OF THE INVENTION

This invention is based upon the finding that the heat spreading function of a heat spreader layer on a circuit assembly is substantially improved when a thermal pathway between a heat-generating component, especially an LED, and the heat spreader layer is provided. Indeed, by the use of such a thermal pathway, the use of graphite-based heat spreader layers can provide improved heat spreading, even as compared to the use of aluminum or copper heat spreaders, with the added benefit of reduced weight.

By the term "circuit assembly" is meant an assembly including one or more electronic circuits positioned on a dielectric material, and can include laminates where one or more of the circuits is sandwiched between layers of dielectric material. Specific examples of circuit assemblies are printed circuit boards and flex circuits, as would be familiar to the skilled artisan.

Before describing the manner in which the invention improves current materials, a brief description of graphite and its formation into flexible sheets, which will become the primary heat spreader for forming the products of the invention, is in order.

Graphite is a crystalline form of carbon comprising atoms covalently bonded in flat layered planes with weaker bonds between the planes. By treating particles of graphite, such as natural graphite flake, with an intercalant of, e.g. a solution of sulfuric and nitric acid, the crystal structure of the graphite reacts to form a compound of graphite and the intercalant. The treated particles of graphite are hereafter referred to as "particles of intercalated graphite." Upon exposure to high temperature, the intercalant within the graphite decomposes and volatilizes, causing the particles of intercalated graphite to expand in dimension as much as about 80 or more times its original volume in an accordion-like fashion in the "c" direction, i.e. in the direction perpendicular to the crystalline planes of the graphite. The exfoliated graphite particles are vermiform in appearance, and are therefore commonly referred to as worms. The worms may be compressed together into flexible sheets that, unlike the original graphite flakes, can be formed and cut into various shapes.

Graphite starting materials suitable for use in the present invention include highly graphitic carbonaceous materials capable of intercalating organic and inorganic acids as well as halogens and then expanding when exposed to heat. These highly graphitic carbonaceous materials most preferably have a degree of graphitization of about 1.0. As used in this disclosure, the term "degree of graphitization" refers to the value g according to the formula:

$$g = \frac{3.45 - d(002)}{0.095}$$

where d(002) is the spacing between the graphitic layers of the carbons in the crystal structure measured in Angstrom units. The spacing d between graphite layers is measured by standard X-ray diffraction techniques. The positions of diffraction peaks corresponding to the (002), (004) and (006) Miller Indices are measured, and standard least-squares techniques are employed to derive spacing which minimizes the total error for all of these peaks. Examples of highly graphitic carbonaceous materials include natural graphites from various sources, as well as other carbonaceous materials such as graphite prepared by chemical vapor deposition, high temperature pyrolysis of polymers, or crystallization from molten metal solutions and the like. Natural graphite is most preferred.

The graphite starting materials used in the present invention may contain non-graphite components so long as the crystal structure of the starting materials maintains the required degree of graphitization and they are capable of exfoliation. Generally, any carbon-containing material, the crystal structure of which possesses the required degree of graphitization and which can be exfoliated, is suitable for use with the present invention. Such graphite preferably has a purity of at least about eighty weight percent. More preferably, the graphite employed for the present invention will have a purity of at least about 94%. In the most preferred embodiment, the graphite employed will have a purity of at least about 98%.

A common method for manufacturing graphite sheet is described by Shane et al. in U.S. Pat. No. 3,404,061, the disclosure of which is incorporated herein by reference. In the typical practice of the Shane et al. method, natural graphite flakes are intercalated by dispersing the flakes in a solution containing e.g., a mixture of nitric and sulfuric acid, advantageously at a level of about 20 to about 300 parts by weight of intercalant solution per 100 parts by weight of graphite flakes (pph). The intercalation solution contains oxidizing and other intercalating agents known in the art. Examples include those containing oxidizing agents and oxidizing mixtures, such as solutions containing nitric acid, potassium chlorate, chromic acid, potassium permanganate, potassium chromate, potassium dichromate, perchloric acid, and the like, or mixtures, such as for example, concentrated nitric acid and chlorate, chromic acid and phosphoric acid, sulfuric acid and nitric acid, or mixtures of a strong organic acid, e.g. trifluoroacetic acid, and a strong oxidizing agent soluble in the organic acid. Alternatively, an electric potential can be used to bring about oxidation of the graphite. Chemical species that can be introduced into the graphite crystal using electrolytic oxidation include sulfuric acid as well as other acids.

In a preferred embodiment, the intercalating agent is a solution of a mixture of sulfuric acid, or sulfuric acid and phosphoric acid, and an oxidizing agent, i.e. nitric acid, perchloric acid, chromic acid, potassium permanganate, hydrogen peroxide, iodic or periodic acids, or the like. Although less preferred, the intercalation solution may contain metal halides such as ferric chloride, and ferric chloride mixed with sulfuric acid, or a halide, such as bromine as a solution of bromine and sulfuric acid or bromine in an organic solvent.

The quantity of intercalation solution may range from about 20 to about 350 pph and more typically about 40 to about 160 pph. After the flakes are intercalated, any excess solution is drained from the flakes and the flakes are water-washed. Alternatively, the quantity of the intercalation solution may be limited to between about 10 and about 40 pph, which permits the washing step to be eliminated as taught and described in U.S. Pat. No. 4,895,713, the disclosure of which is also herein incorporated by reference.

The particles of graphite flake treated with intercalation solution can optionally be contacted, e.g. by blending, with a reducing organic agent selected from alcohols, sugars, aldehydes and esters which are reactive with the surface film of oxidizing intercalating solution at temperatures in the range of 25° C. and 125° C. Suitable specific organic agents include hexadecanol, octadecanol, 1-octanol, 2-octanol, decylalcohol, 1,10 decanediol, decylaldehyde, 1-propanol, 1,3 propanediol, ethyleneglycol, polypropylene glycol, dextrose, fructose, lactose, sucrose, potato starch, ethylene glycol monostearate, diethylene glycol dibenzoate, propylene glycol monostearate, glycerol monostearate, dimethyl oxylate, diethyl oxylate, methyl formate, ethyl formate, ascorbic acid and lignin-derived compounds, such as sodium lignosulfate. The amount of organic reducing agent is suitably from about 0.5 to 4% by weight of the particles of graphite flake.

The use of an expansion aid applied prior to, during or immediately after intercalation can also provide improvements. Among these improvements can be reduced exfoliation temperature and increased expanded volume (also referred to as "worm volume"). An expansion aid in this context will advantageously be an organic material sufficiently soluble in the intercalation solution to achieve an improvement in expansion. More narrowly, organic materials of this type that contain carbon, hydrogen and oxygen, preferably exclusively, may be employed. Carboxylic acids have been found especially effective. A suitable carboxylic acid useful as the expansion aid can be selected from aromatic, aliphatic or cycloaliphatic, straight chain or branched chain, saturated and unsaturated monocarboxylic acids, dicarboxylic acids and polycarboxylic acids which have at least 1 carbon atom, and preferably up to about 15 carbon atoms, which is soluble in the intercalation solution in amounts effective to provide a measurable improvement of one or more aspects of exfoliation. Suitable organic solvents can be employed to improve solubility of an organic expansion aid in the intercalation solution.

Representative examples of saturated aliphatic carboxylic acids are acids such as those of the formula $H(CH_2)_n COOH$ wherein n is a number of from 0 to about 5, including formic, acetic, propionic, butyric, pentanoic, hexanoic, and the like. In place of the carboxylic acids, the anhydrides or reactive carboxylic acid derivatives such as alkyl esters can also be employed. Representative of alkyl esters are methyl formate and ethyl formate. Sulfuric acid, nitric acid and other known aqueous intercalants have the ability to decompose formic acid, ultimately to water and carbon dioxide. Because of this, formic acid and other sensitive expansion aids are advantageously contacted with the graphite flake prior to immersion of the flake in aqueous intercalant. Representative of dicarboxylic acids are aliphatic dicarboxylic acids having 2-12 carbon atoms, in particular oxalic acid, fumaric acid, malonic acid, maleic acid, succinic acid, glutaric acid, adipic acid, 1,5-pentanedicarboxylic acid, 1,6-hexanedicarboxylic acid, 1,10-decanedicarboxylic acid, cyclohexane-1,4-dicarboxylic acid and aromatic dicarboxylic acids such as phthalic acid or terephthalic acid. Representative of alkyl esters are dimethyl oxylate and diethyl oxylate. Representative of cycloaliphatic acids is cyclohexane carboxylic acid and of aromatic carboxylic acids are benzoic acid, naphthoic acid, anthranilic acid, p-aminobenzoic acid, salicylic acid, o-, m- and p-tolyl acids, methoxy and ethoxybenzoic acids, acetoacetamidobenzoic acids and, acetamidobenzoic acids, phenylacetic acid and naphthoic acids. Representative of hydroxy aromatic acids are hydroxybenzoic acid, 3-hydroxy-1-naphthoic acid, 3-hydroxy-2-naphthoic acid, 4-hydroxy-2-naphthoic acid, 5-hydroxy-1-naphthoic acid, 5-hydroxy-2-naphthoic acid, 6-hydroxy-2-naphthoic acid and 7-hydroxy-2-naphthoic acid. Prominent among the polycarboxylic acids is citric acid.

The intercalation solution will be aqueous and will preferably contain an amount of expansion aid of from about 1 to 10%, the amount being effective to enhance exfoliation. In the embodiment wherein the expansion aid is contacted with the graphite flake prior to or after immersing in the aqueous intercalation solution, the expansion aid can be admixed with the graphite by suitable means, such as a V-blender, typically in an amount of from about 0.2% to about 10% by weight of the graphite flake.

After intercalating the graphite flake, and following the blending of the intercalant coated intercalated graphite flake with the organic reducing agent, the blend is exposed to temperatures in the range of 25° to 125° C. to promote reaction of the reducing agent and intercalant coating. The heating period is up to about 20 hours, with shorter heating periods, e.g., at least about 10 minutes, for higher temperatures in the above-noted range. Times of one half hour or less, e.g., on the order of 10 to 25 minutes, can be employed at the higher temperatures.

The thusly treated particles of graphite are sometimes referred to as "particles of intercalated graphite." Upon exposure to high temperature, e.g. temperatures of at least about 160° C. and especially about 700° C. to 1000° C. and higher, the particles of intercalated graphite expand as much as about 80 to 1000 or more times their original volume in an accordion-like fashion in the c-direction, i.e. in the direction perpendicular to the crystalline planes of the constituent graphite particles. The expanded, i.e. exfoliated, graphite particles are vermiform in appearance, and are therefore commonly referred to as worms. The worms may be compressed together into flexible sheets that, unlike the original graphite flakes, can be formed and cut into various shapes.

Flexible graphite sheet and foil are coherent, with good handling strength, and are suitably compressed, e.g. by roll pressing, to a thickness of about 0.075 mm to 3.75 mm and a typical density of about 0.1 to 1.5 grams per cubic centimeter ($g/cm^3$). From about 1.5-30% by weight of ceramic additives can be blended with the intercalated graphite flakes as described in U.S. Pat. No. 5,902,762 (which is incorporated herein by reference) to provide enhanced resin impregnation in the final flexible graphite product. The additives include ceramic fiber particles having a length of about 0.15 to 1.5 millimeters. The width of the particles is suitably from about 0.04 to 0.004 mm. The ceramic fiber particles are non-reactive and non-adhering to graphite and are stable at temperatures up to about 1100° C., preferably about 1400° C. or higher. Suitable ceramic fiber particles are formed of macerated quartz glass fibers, carbon and graphite fibers, zirconia, boron nitride, silicon carbide and magnesia fibers, naturally occurring mineral fibers such as calcium metasilicate fibers, calcium aluminum silicate fibers, aluminum oxide fibers and the like.

The above described methods for intercalating and exfoliating graphite flake may beneficially be augmented by a pretreatment of the graphite flake at graphitization temperatures, i.e. temperatures in the range of about 3000° C. and above and by the inclusion in the intercalant of a lubricious additive, as described in International Patent Application No. PCT/US02/39749, the disclosure of which is incorporated herein by reference.

The pretreatment, or annealing, of the graphite flake results in significantly increased expansion (i.e., increase in expansion volume of up to 300% or greater) when the flake is subsequently subjected to intercalation and exfoliation. Indeed, desirably, the increase in expansion is at least about 50%, as compared to similar processing without the annealing step. The temperatures employed for the annealing step should not be significantly below 3000° C., because temperatures even 100° C. lower result in substantially reduced expansion.

The annealing of the present invention is performed for a period of time sufficient to result in a flake having an enhanced degree of expansion upon intercalation and subsequent exfoliation. Typically the time required will be 1 hour or more, preferably 1 to 3 hours and will most advantageously proceed in an inert environment. For maximum beneficial results, the annealed graphite flake will also be subjected to other processes known in the art to enhance the degree expansion—namely intercalation in the presence of an organic reducing agent, an intercalation aid such as an organic acid, and a surfactant wash following intercalation. Moreover, for maximum beneficial results, the intercalation step may be repeated.

The annealing step of the instant invention may be performed in an induction furnace or other such apparatus as is known and appreciated in the art of graphitization; for the temperatures here employed, which are in the range of 3000° C., are at the high end of the range encountered in graphitization processes.

Because it has been observed that the worms produced using graphite subjected to pre-intercalation annealing can sometimes "clump" together, which can negatively impact area weight uniformity, an additive that assists in the formation of "free flowing" worms is highly desirable. The addition of a lubricious additive to the intercalation solution facilitates the more uniform distribution of the worms across the bed of a compression apparatus (such as the bed of a calender station) conventionally used for compressing (or "calendering") graphite worms into flexible graphite sheet. The resulting sheet therefore has higher area weight uniformity and greater tensile strength. The lubricious additive is preferably a long chain hydrocarbon, more preferably a hydrocarbon having at least about 10 carbons. Other organic compounds having long chain hydrocarbon groups, even if other functional groups are present, can also be employed.

More preferably, the lubricious additive is an oil, with a mineral oil being most preferred, especially considering the fact that mineral oils are less prone to rancidity and odors, which can be an important consideration for long term storage. It will be noted that certain of the expansion aids detailed above also meet the definition of a lubricious additive. When these materials are used as the expansion aid, it may not be necessary to include a separate lubricious additive in the intercalant.

The lubricious additive is present in the intercalant in an amount of at least about 1.4 pph, more preferably at least about 1.8 pph. Although the upper limit of the inclusion of lubricous additive is not as critical as the lower limit, there does not appear to be any significant additional advantage to including the lubricious additive at a level of greater than about 4 pph.

The flexible graphite sheets of the present invention may, if desired, utilize particles of reground flexible graphite sheets rather than freshly expanded worms, as discussed in U.S. Pat.

No. 6,673,289 to Reynolds, Norley and Greinke, the disclosure of which is incorporated herein by reference. The sheets may be newly formed sheet material, recycled sheet material, scrap sheet material, or any other suitable source.

Also the processes of the present invention may use a blend of virgin materials and recycled materials.

The source material for recycled materials may be sheets or trimmed portions of sheets that have been compression molded as described above, or sheets that have been compressed with, for example, pre-calendering rolls, but have not yet been impregnated with resin. Furthermore, the source material may be sheets or trimmed portions of sheets that have been impregnated with resin, but not yet cured, or sheets or trimmed portions of sheets that have been impregnated with resin and cured. The source material may also be recycled flexible graphite proton exchange membrane (PEM) fuel cell components such as flow field plates or electrodes. Each of the various sources of graphite may be used as is or blended with natural graphite flakes.

Once the source material of flexible graphite sheets is available, it can then be comminuted by known processes or devices, such as a jet mill, air mill, blender, etc. to produce particles. Preferably, a majority of the particles have a diameter such that they will pass through 20 U.S. mesh; more preferably a major portion (greater than about 20%, most preferably greater than about 50%) will not pass through 80 U.S. mesh. Most preferably the particles have a particle size of no greater than about 20 U.S. mesh. It may be desirable to cool the flexible graphite sheet when it is resin-impregnated as it is being comminuted to avoid heat damage to the resin system during the commination process.

The size of the comminuted particles may be chosen so as to balance machinability and formability of the graphite article with the thermal characteristics desired. Thus, smaller particles will result in a graphite article which is easier to machine and/or form, whereas larger particles will result in a graphite article having higher anisotropy, and, therefore, greater in-plane electrical and thermal conductivity.

Once the source material is comminuted, it is then re-expanded. The re-expansion may occur by using the intercalation and exfoliation process described above and those described in U.S. Pat. No. 3,404,061 to Shane et al. and U.S. Pat. No. 4,895,713 to Greinke et al.

Typically, after intercalation the particles are exfoliated by heating the intercalated particles in a furnace. During this exfoliation step, intercalated natural graphite flakes may be added to the recycled intercalated particles. Preferably, during the re-expansion step the particles are expanded to have a specific volume in the range of at least about 100 cc/g and up to about 350 cc/g or greater. Finally, after the re-expansion step, the re-expanded particles may be compressed into flexible sheets, as hereinafter described.

According to the invention, graphite sheets prepared as described above (which typically have a thickness of about 0.075 mm to about 10 mm, but which can vary depending, e.g., on the degree of compression employed) are can be treated with resin and the absorbed resin, after curing, enhances the moisture resistance and handling strength, i.e. stiffness, of the sheet as well as "fixing" the morphology of the sheet. The amount of resin within the epoxy impregnated graphite sheets should be an amount sufficient to ensure that the final assembled and cured layered structure is dense and cohesive, yet the anisotropic thermal conductivity associated with a densified graphite structure has not been adversely impacted. Suitable resin content is preferably at least about 5% by weight, more preferably about 10 to 35% by weight, and suitably up to about 60% by weight.

Resins found especially useful in the practice of the present invention include acrylic-, epoxy- and phenolic-based resin systems, fluoro-based polymers, or mixtures thereof. Suitable epoxy resin systems include those based on diglycidyl ether of bisphenol A (DGEBA) and other multifunctional resin systems; phenolic resins that can be employed include resole and novolac phenolics. Optionally, the flexible graphite may be impregnated with fibers and/or salts in addition to the resin or in place of the resin. Additionally, reactive or non-reactive additives may be employed with the resin system to modify properties (such as tack, material flow, hydrophobicity, etc.).

One type of apparatus for continuously forming resin-impregnated and compressed flexible graphite materials is shown in U.S. Pat. No. 6,706,400 to Mercuri, Capp, Warddrip and Weber, the disclosure of which is incorporated herein by reference.

Advantageously, when the sheets of compressed particles of exfoliated graphite are resin-impregnated, following the compression step (such as by calendering), the impregnated materials are cut to suitable-sized pieces and placed in a press, where the resin is cured at an elevated temperature. In addition, the flexible graphite sheets can be employed in the form of a laminate, which can be prepared by stacking together individual graphite sheets in the press.

The temperature employed in the press should be sufficient to ensure that the graphite structure is densified at the curing pressure, while the thermal properties of the structure are not adversely impacted. Generally, this will require a temperature of at least about 90° C., and generally up to about 200° C. Most preferably, cure is at a temperature of from about 150° C. to 200° C. The pressure employed for curing will be somewhat a function of the temperature utilized, but will be sufficient to ensure that the graphite structure is densified without adversely impacting the thermal properties of the structure. Generally, for convenience of manufacture, the minimum required pressure to densify the structure to the required degree will be utilized. Such a pressure will generally be at least about 7 megapascals (Mpa, equivalent to about 1000 pounds per square inch), and need not be more than about 35 Mpa (equivalent to about 5000 psi), and more commonly from about 7 to about 21 Mpa (1000 to 3000 psi). The curing time may vary depending on the resin system and the temperature and pressure employed, but generally will range from about 0.5 hours to 2 hours. After curing is complete, the materials are seen to have a density of at least about 1.8 g/cm$^3$ and commonly from about 1.8 g/cm$^3$ to 2.0 g/cm$^3$.

Advantageously, when the flexible graphite sheets are themselves presented as a laminate, the resin present in the impregnated sheets can act as the adhesive for the laminate. According to another embodiment of the invention, however, the calendered, impregnated, flexible graphite sheets are coated with an adhesive before the flexible sheets are stacked and cured. Suitable adhesives include epoxy-, acrylic- and phenolic-based resins. Phenolic resins found especially useful in the practice of the present invention include phenolic-based resin systems including resole and novolak phenolics.

Although the formation of sheets through calendering or molding is the most common method of formation of the graphite materials useful in the practice of the present invention, other forming methods can also be employed.

The temperature- and pressure-cured graphite/resin composites of the present invention provide a graphite-based composite material having in-plane thermal conductivity rivaling or exceeding that of copper, at a fraction of the weight of copper. More specifically, the composites exhibit in-plane thermal conductivities of at least about 300 W/m° K, with through-plane thermal conductivities of less than about 15 W/m° K, more preferably less than about 10 W/m° K.

Figure 1:
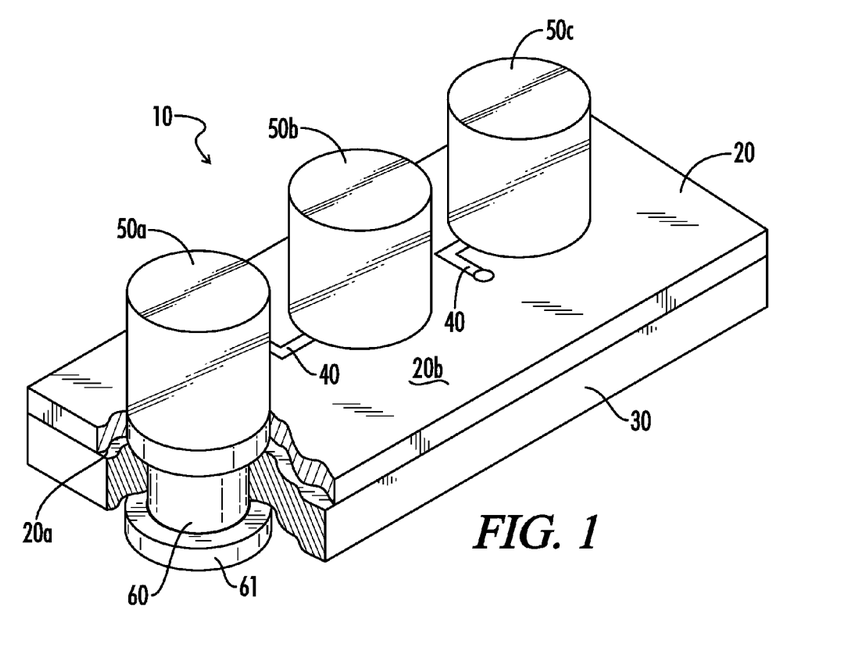
FIG. 1 is a partially broken-away perspective view of a circuit assembly in accordance with the present invention, having a heat spreader layer on one surface thereof and a thermal pathway between the heat spreader layer and a heat-generating component located on a second surface of the circuit assembly.

Referring now to the drawings, and, in particular, FIG. 1, a circuit assembly in accordance with the invention is denoted by the reference numeral 10. Circuit assembly 10 includes at least a dielectric layer 20 and a heat spreader layer 30, where heat spreader layer 30 abuts dielectric layer 20. Preferably, heat spreader layer 30 comprises at least one sheet of compressed particles of exfoliated graphite, prepared as described above. Circuit assembly 10 is generally either a printed circuit board or flex circuit, but can also comprise, for example, a printed or silk-screened pattern of conductive ink on dielectric layer 20.

Circuit assembly 10 also generally comprises a circuit 40 thereon, conventionally formed of copper, applied to dielectric layer 20 by photolithographic methods, sputtering, screen printing or the like. As noted above, circuit 40 can also be formed of a conductive ink applied to dielectric layer 20 by, for example, printing or silk-screening processes.

Dielectric layer 20 can be that conventional in the printed circuit board industry, such as glass fiber with resin (FR-4), preferably formed as a laminate; polytetrafluoroethylene (PTFE), commercially available as Teflon brand materials; and expanded PTFE, sometimes denoted ePTFE, as well as resin-impregnated or -imbibed versions of the foregoing. In addition, dielectric layer 20 can be a polymer such as a polyimide or polyester, as used in the formation of flex circuits. Dielectric layer 20 can also comprise a ceramic material, such as aluminum nitride, aluminum oxide or alumina, present as a discrete layer, or applied to a substrate layer (such as heat spreader layer 30) through, for example, an anodization, vapor deposition, or flame-spraying process; the use of anodization is especially relevant where heat spreader layer 30 is aluminum.

In addition, in certain circumstances it may be desirable to at least partially encapsulate heat spreader layer 30 or provide a coating on a surface of heat spreader layer 30 to prevent particulate matter from flaking off heat spreader layer 30. For instance, there is the perception by some that graphite materials are prone to flaking. Whether true or not, providing a coating of a polymeric material (typically on the order of less than 20 microns in thickness) such as Mylar material to inhibit flaking can allay this perception. In this case, the polymeric material can act as dielectric layer 20 for circuit assembly 10, since the material used can be electrically non-conductive, yet thin enough to not substantially interfere with thermal conduction to heat spreader layer 30. Alternatively, an anodized aluminum layer can also be used to inhibit flaking, with the anodization layer also acting as dielectric layer 20.

Preferably, heat spreader layer 30 is from about 0.25 mm to about 25 mm in thickness, more preferably from about 0.5 mm to about 14 mm in thickness, and comprises at least one graphite sheet. Advantageously, heat spreader layer 30 can be a laminate of up to ten or more graphite sheets, to provide the desired heat spreading capabilities. The graphite composite can be used to at least partially, and, in the preferred embodiments, completely replace the use of copper or other metals as the circuit assembly heat spreader.

Surprisingly, when heat spreader layer 30, especially when formed of one or more sheets of compressed particles of exfoliated graphite, is rendered black, such as by painting, improved thermal resistance is observed. In other words, where those surfaces of graphite heat spreader layer 30 not abutting dielectric layer 20 are black, the effective thermal resistance of the heat path from the heat generating component is decreased. Although the precise reason for this is not known, it is believed that rendering graphite heat spreader layer 30 black improves the emissivity of spreader layer 30, thereby improving the ability of heat spreader layer 30 to radiate heat.

Figure 7:
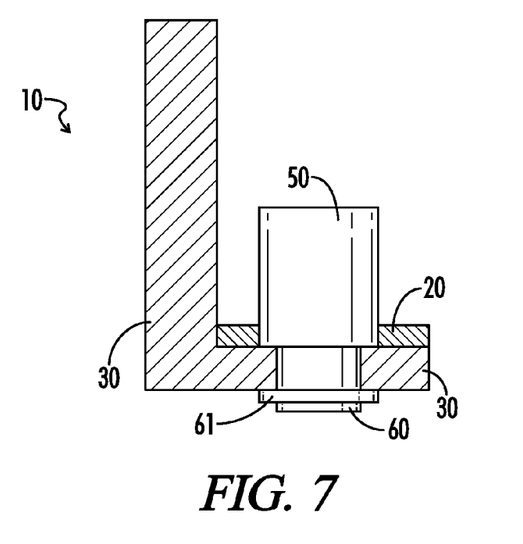
FIG. 7 is a side cross-sectional view of an embodiment of a circuit assembly in accordance with the present invention, illustrating the embodiment wherein the heat spreader layer is located such that the heat spreader layer extends perpendicular to the LED mounting plane.

Heat spreader layer 30 is not necessarily planar, but may include one or more "bends," to form a 3-dimensional shape. This is especially advantageous where it is desired that circuit assembly 10 is on a different plane from heat spreader layer 30. This arrangement is employed in sidelit liquid crystal displays ("LCD displays"), for example, where LEDs are mounted on circuit assembly 10 in a plane with limited space (i.e., the thickness of the LCD display), and heat spreader layer 30 extends perpendicular to the LED mounting plane.

Indeed, in one embodiment of the invention, heat spreader layer 30 has a larger surface area than dielectric layer 20 and any circuit 40 thereon. In this way, dielectric layer 20 and heat-generating component(s) 50, as well as circuit(s) 40, can lie in one plane (such as the LED plane for sidelit LCD displays), while heat spreader layer 30 can extend into another plane (such as a perpendicular plane, with an approximately 90° bend, as in the rear plane of the LCD display), as described above, and thereby spread heat into such other plane for additional dissipation.

The graphite/dielectric material laminate can be formed by laminating together dielectric layers 20 and heat spreader layer 30 in a manner conventional in the formation of circuit assembly laminates, using conventional adhesives, for instance. Alternatively, graphite/dielectric material laminate can be formed in the pre-pressed stack while pressure curing the graphite materials. The epoxy polymer in the impregnated graphite sheets is sufficient, upon curing, to adhesively bond the non-graphite as well as the impregnated graphite layers of the structure into place. In any event, in the preferred embodiment, a graphite composite is employed as heat spreader layer 30 for circuit assembly 10, to replace the copper or aluminum heat spreader in a so-called "metal-backed" printed circuit board or in a flex circuit.

As noted above, dielectric material 20 forming the central portion of circuit assembly 10 has two major surfaces 20a and 20b. Heat spreader layer 30 abuts one of the surfaces 20a of dielectric material 20; the other surface 20b has located thereon at least one heat generating component 50, and often a plurality of heat generating components 50a, 50b, 50c, etc., such as LEDs, chipsets, or other components familiar to the skilled artisan. Heat generating component 50 is located so as to be in contact with a portion of circuit 40 lying on surface 20b of circuit assembly 10 on which component 50 is located.

Certain manufacturers' LEDs include thermal slugs to help dissipate heat from the LED itself; these thermal slugs are often not considered to be electrically neutral. Accordingly, when more than one of such LEDs is located on circuit assembly 10, care must be taken to avoid electrical shorts between the slugs on two or more LEDs on the assembly; thus, the respective LEDs must be electrically isolated.

In order to facilitate the transfer of heat from heat generating component 50 to heat spreader layer 30, a thermal pathway 60 extends through heat spreader layer 30, adjacent heat generating component 50. Advantageously, thermal pathway 60 also extends through circuit assembly 10 between each heat generating component 50 and heat spreader layer 30. Thermal pathway 60 comprises a slug or "rivet" of a high thermal conductivity material, such as copper or alloys thereof, although other high thermal conductivity materials like aluminum or compressed particles of exfoliated graphite can be used. By "high thermal conductivity" is meant that the thermal conductivity of thermal pathway 60 in the direction between heat generating component 50 and heat spreader layer 30 is greater than the through-thickness thermal conductivity of dielectric layer 30; preferably, the thermal conductivity of thermal pathway 60 is at least about 100 W/m° K, more preferably at least about 200 W/m° K, and even more preferably above 350 W/m° K. Each thermal pathway 60 can assume any particular cross-sectional shape, although most commonly, thermal pathway 60 will be cylindrical in shape.

Thermal pathway 60 can be a single integral element, but may also comprise more than one piece, such as a pair of separate parts that are press-fit or otherwise attached together. In addition, thermal pathway 60 may advantageously have a shoulder or step on the side adjacent dielectric layer, for positional considerations. If electrical isolation is required a dielectric layer, such as anodized aluminum, aluminum nitride, aluminum oxide or alumina, can be placed onto some or all surfaces of the thermal pathway 60, like flame-sprayed or vapor deposited alumina on copper, or through the use of anodized aluminum as thermal pathway 60, for example. In addition, surfaces of thermal pathway 60 can remain solderable, or can be plated to be solderable, to facilitate joinder of heat generating component 50 to thermal pathway 60.

Each thermal pathway 60 extends into heat spreader layer 30 and is brought into thermal contact with heat spreader layer 30. For instance, thermal pathway 60 can be fitted into a slot or hole in heat spreader layer 30 using a thermal adhesive or a pressure fitting 61, such as a so-called "speed nut," in order to ensure good thermal contact between thermal pathway 60 and heat spreader layer 30, and to ensure heat transfer from thermal pathway 60 across the thickness of spreader layer 30. One suitable way thermal pathway 60 is fitted into spreader layer 30 so as to establish adequate thermal contact is to force thermal pathway 60 through an opening in spreader layer 30 which has a diameter smaller than that of thermal pathway 60; in this way, the act of forcing thermal pathway 60 through the opening provides a pressure fitting between the two. Alternatively, the hole in spreader layer 30 can be formed by using thermal pathway 60 itself as a punch. The nature of sheets of compressed particles of exfoliated graphite can permit such a fitting to be accomplished without undue damage to either thermal pathway 60 or heat spreader layer 30.

Figure 2A:
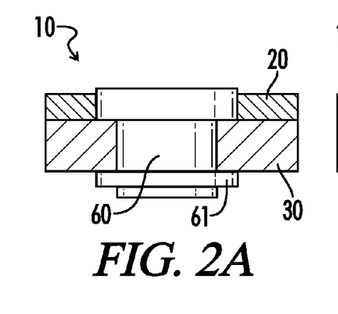
FIGS. 2A-2C are partial cross sectional views of different alternative arrangements of the thermal pathway of the circuit assembly of FIG. 1, showing taken along line 2-2 of FIG. 1 and showing the thermal pathway extending above, flush with and recessed into the second surface of the circuit assembly, respectively.

Similarly, thermal pathway 60 needs to be in good thermal contact with heat generating component 50. Thus, thermal pathway 60 needs to be thermally connected to heat generating component 50 or adhered thereto using solder, a thermal grease, a thermal adhesive like an epoxy, a sheet of compressed particles of exfoliated graphite, or the like. As such, thermal pathway 60 preferably extends through circuit assembly 10 and is exposed at the surface of circuit assembly 10 on which heat generating component 50 is located. Thus, in this embodiment, thermal pathway 60 has a length approximately equal to the combined thickness of dielectric layer 20 and heat spreader layer 30, plus any distance thermal pathway 60 extends from either dielectric layer 20 or heat spreader layer 30, as shown in FIG. 2A. Alternatively, thermal vias or a thermally conductive dielectric material may be used to transfer heat from heat generating component to thermal pathway 60, with thermal pathway 60 extending only through heat spreader layer 30 to spread heat through the thickness of heat spreader layer 30; therefore, in this situation, thermal pathway 60 will have a length approximately equal to the thickness of heat spreader layer 30, plus any distance thermal pathway 60 extends from the surface of heat spreader layer 30.

Figure 2B:
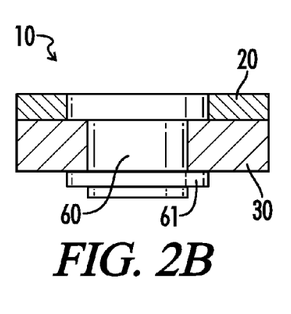
Figure 2C:
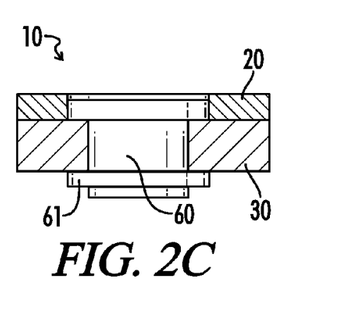

In order to provide good thermal contact between thermal pathway 60 and heat generating component 50, thermal pathway 60 can extend above the surface 20b of dielectric layer 20, as shown in FIG. 2A. Alternatively, thermal pathway 60 can lie flush with surface 20b of dielectric layer 20, as shown in FIG. 2B, or be recessed with respect to surface 20b of dielectric layer 20, as shown in FIG. 2C, depending on the nature of heat generating component 50 and the preferred method of providing thermal attachment between thermal pathway 60 and heat generating component 50.

One advantageous method for providing good thermal contact between thermal pathway 60 and heat spreader layer 30 is by the use of a "rivet"-type thermal pathway 60. In this way, in the same manner a rivet is compressed to seal against a substrate, a rivet-style thermal pathway 60 can be compressed or forced to seal against the outer surface of heat spreader layer 30 (i.e., the surface not abutting the dielectric layer), creating a good thermal connection between the two.

As noted above, heat spreader layer 30 is advantageously laminated or adhered to dielectric layer 20. However, it is contemplated that the use of thermal pathway 60 can permit a gap to be present between heat spreader layer 30 and dielectric layer 20, to optimize heat dissipation. In other words, since heat transfer between heat generating component 50 and heat spreader layer 30 is primarily through thermal pathway 60, as opposed to primarily through dielectric layer 20, it is not necessary for heat spreader layer 30 to be in contact with dielectric layer 20. Thus, a gap, of about 1 mm or even greater, can be provided between heat spreader layer 30 and dielectric layer 20, such as by the use of spacers, etc. (not shown). In this way, provided heat spreader layer 30 remains in thermal contact with thermal pathway 60, more surface area of heat spreader layer 30 is exposed, and more heat can be dissipated therefrom. Put simply, in this embodiment, heat spreader layer 30 acts as both a heat spreader and a heat dissipation fin.

Figure 4:
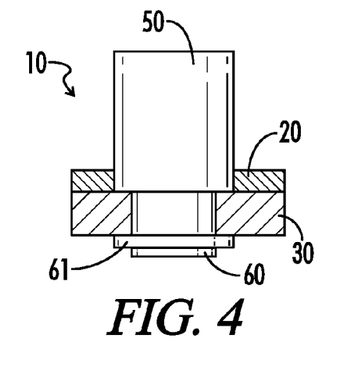
FIG. 4 is a partial cross-sectional view of a circuit assembly in accordance with the present invention, having a heat spreader layer on one surface thereof and a thermal pathway between the heat spreader layer and a heat-generating component located on a second surface of the circuit assembly, wherein the thermal pathway is integral with the heat-generating component.

In an alternative embodiment illustrated in FIG. 4, thermal pathway 60 can be integral with heat generating component 50. For instance, an LED, if used as heat generating component 50, can have a high thermal conductivity slug or rivet extending therefrom, which can then extend through circuit assembly 10 and into thermal contact with heat spreader layer 30 (for instance, through a pressure fitting or rivet-style connection, as discussed above), to facilitate heat spreading from the LED to heat spreader layer 30.

Figure 6A:
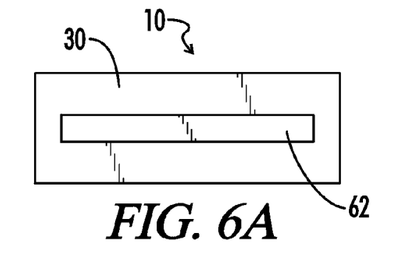
FIG. 6A is a bottom plan view of a circuit assembly in accordance with the present invention, having an elongated-base thermal pathway collection.
Figure 6B:
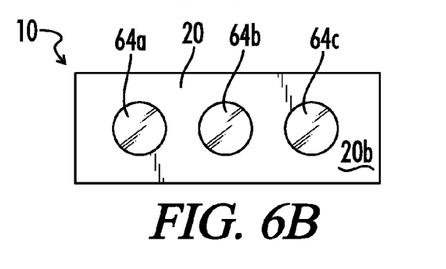
FIG. 6B is a top plan view of the circuit assembly of FIG. 6A.

In still another embodiment of the invention, shown in FIGS. 6A and 6B, thermal pathway(s) 60 can be present on a collection bar 62 extending through heat spreader layer 30, as shown in FIG. 6B, where collection bar 62 comprises an elongate member having individual thermal pathway units 64a, 64b, 64c, etc. extending therefrom and up through dielectric layer 20, as shown in FIG. 6B. Alternatively, a collection bar can extend through dielectric layer 20, with individual thermal pathway units extending through heat spreader layer 30 (not shown).

Figure 5:
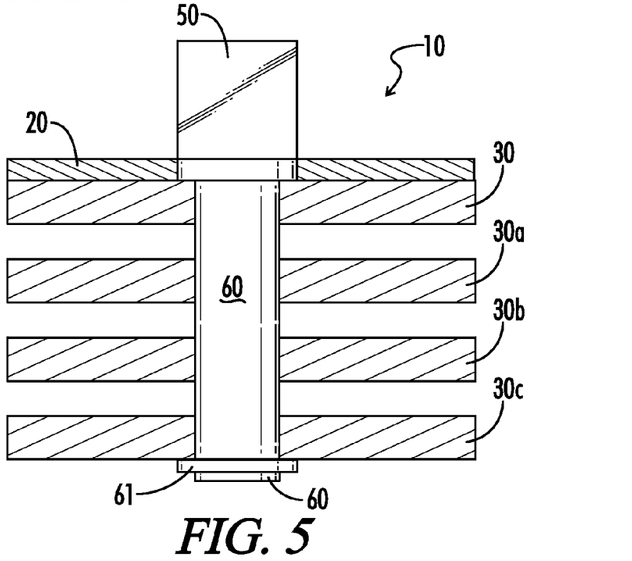
FIG. 5 is a partial cross-sectional view of a circuit assembly in accordance with the present invention, having a heat spreader layer on one surface thereof and a thermal pathway between the heat spreader layer and a heat-generating component located on a second surface of the circuit assembly, wherein the thermal pathway extends beyond the heat spreader layer and supports additional heat dissipation layers.

In yet another embodiment of the invention, as illustrated in FIG. 5, thermal pathway 60 can extend through and beyond heat spreader layer 30, in order to act as a support for further heat dissipation layers 30a, 30b, 30c, etc., such as heat spreader layers or heat dissipation fins. In other words, if space allows, thermal pathway 60 can extend through heat spreader layer 30, and other heat spreader layers or heat dissipation fins 30a, 30b, 30c, etc. (preferably also formed of sheets of compressed particles of exfoliated graphite) can then be placed in thermal contact with thermal pathway 60 and, with an air gap between the additional layers or fins 30a, 30b, 30c, etc., provide additional heat dissipation. Spacers (not shown) can be employed to maintain the separation of layers 30a, 30b, 30c, etc.

Figure 3:
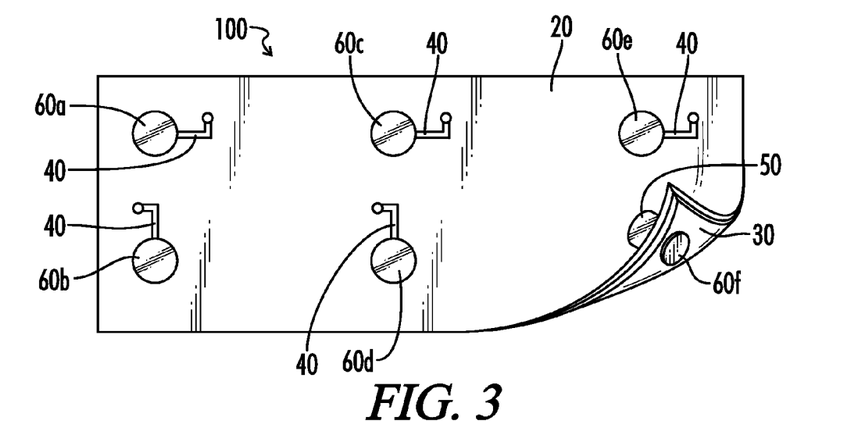
FIG. 3 is a partially broken-away perspective view of a flex circuit in accordance with the present invention, having a heat spreader layer on one surface thereof and a plurality of thermal pathways between the heat spreader layer and heat-generating components located on a second surface of the flex circuit.

As illustrated in FIG. 3, the present invention is especially useful when the circuit assembly is a flex circuit 100. Because of the nature of flex circuit 100, conventional heat spreader materials, which are relatively rigid as compared with compressed sheets of exfoliated graphite, are impractical. However, the use of one or more compressed sheets of exfoliated graphite as heat spreader layer 30 will effectively spread heat from a heat generating component 50, through thermal pathway 60 without severely compromising flexibility. Moreover, since each thermal pathway 60 is a discrete article, even the inclusion of a plurality of thermal pathways 60a, 60b, 60c, etc. will not substantially compromise flexibility.

Accordingly, by the use of the present invention, effective heat spreading in a circuit assembly can be accomplished to a degree not heretofore seen, even in the case of flex circuits and even where the heat source is an LED.

All cited patents, patent applications and publications referred to in this application are incorporated by reference.

The above description is intended to enable the person skilled in the art to practice the invention. It is not intended to detail all of the possible variations and modifications that will become apparent to the skilled worker upon reading the description. It is intended, however, that all such modifications and variations be included within the scope of the invention that is defined by the following claims. The claims are intended to cover the indicated elements and steps in any arrangement or sequence that is effective to meet the objectives intended for the invention, unless the context specifically indicates the contrary.

What is claimed is:

1. A circuit assembly comprising a substrate which comprises a dielectric layer, a heat spreader layer which comprises at least one sheet of compressed particles of exfoliated graphite having two major surfaces, wherein the heat spreader layer is located at a first surface of the substrate, wherein the second surface of the substrate has a circuit thereon and an LED having an LED mounting plane mounted on the circuit, and a thermal pathway in thermal connection with both the heat spreader layer and the LED, wherein the thermal pathway has a length such that it extends through the substrate and at least substantially through the heat spreader layer and further wherein the surface area of the major surface of the heat spreader layer which is located at the first surface of the substrate is greater than the surface area of the surface of the substrate at which the heat spreader layer is located such that the heat spreader layer extends perpendicular to the LED mounting plane.

2. The circuit assembly of claim 1, wherein the dielectric layer comprises a material selected from the group consisting of glass fiber impregnated with resin; polytetrafluoroethylene; expanded polytetrafluoroethylene; a polymer; a ceramic material; or combinations thereof.

3. The circuit assembly of claim 1, wherein the dielectric layer comprises anodized aluminum, aluminum nitride, aluminum oxide or alumina.

4. The circuit assembly of claim 1, wherein the thermal pathway comprises a thermally conductive material.

5. The circuit assembly of claim 4, wherein the thermal conductivity of the thermal pathway is greater than the through-thickness thermal conductivity of the dielectric layer.

6. The circuit assembly of claim 5, wherein the thermal pathway comprises copper, aluminum, or alloys thereof.

7. The circuit assembly of claim 5, further comprising a dielectric layer on the thermal pathway, wherein the dielectric layer comprises anodized aluminum, aluminum nitride, aluminum oxide or alumina.

8. The circuit assembly of claim 7, wherein the heat spreader layer is bent at an angle of about 90°.

9. The circuit assembly of claim 1, wherein a thermal interface material is positioned between the heat generating component and the thermal pathway.

10. The circuit assembly of claim 9 wherein the thermal interface material comprises a grease, an epoxy material, solder, a sheet of compressed particles of exfoliated graphite, or combinations thereof.

11. The circuit assembly of claim 1, wherein the heat spreader layer has a black outer surface.

12. The circuit assembly of claim 1, wherein the heat spreader layer is at least partially encapsulated.

13. The circuit assembly of claim 12, wherein the heat spreader layer is at least partially encapsulated in a polymer or anodized aluminum.

14. The circuit assembly of claim 13, wherein the polymer or anodized aluminum which encapsulates the heat spreader layer comprises the dielectric layer.

15. The circuit assembly of claim 1, wherein the LED has a thermally conductive slug or rivet extending therefrom.

16. The circuit assembly of claim 15, wherein the slug or rivet extends into thermal contact with the heat spreader layer.

17. The circuit assembly of claim 1, wherein the thermal pathway comprises a collection bar having a plurality of thermal pathway units extending therefrom.

18. A circuit assembly comprising a substrate which comprises a dielectric layer having two surfaces, a heat spreader layer comprising at least one sheet of compressed particles of exfoliated graphite having two major surfaces, wherein the heat spreader layer is positioned adjacent a first surface of the substrate, a circuit located at a second surface of the substrate with an LED having an LED mounting plane mounted on the circuit, and a thermal pathway which extends through the substrate and is in thermal connection with both the heat spreader layer and the LED, wherein the surface area of one of the major surfaces of the heat spreader layer is greater than the surface area of the first surface of the substrate such that the heat spreader layer extends perpendicular to the LED mounting plane and beyond the second surface of the substrate.

19. The circuit assembly of claim 18, wherein there is a gap between the substrate and the heat spreader layer.

20. The circuit assembly of claim 18, wherein the thermal pathway comprises a thermally conductive material.

21. The circuit assembly of claim 20, wherein the thermal conductivity of the thermal pathway is greater than the through-thickness thermal conductivity of the dielectric layer.

22. The circuit assembly of claim 19, wherein the heat spreader layer has a black outer surface.

23. The circuit assembly of claim 19, wherein the heat spreader layer is at least partially encapsulated.

24. A flex circuit comprising a substrate which comprises a flexible dielectric layer, a heat spreader layer comprising at least one sheet of compressed particles of exfoliated graphite having two major surfaces, wherein the heat spreader layer is located at a first surface of the substrate, a circuit located at a second surface of the substrate with an LED having an LED mounting plane mounted on the circuit, and a thermal pathway in thermal connection with both the heat spreader layer and the LED, wherein the thermal pathway has a length at least equal to the thickness of the substrate and heat spreader layer and further wherein the surface area of one of the major surfaces of the heat spreader layer is greater than the surface area of the surface of the substrate at which the heat spreader layer is located such that the heat spreader layer extends perpendicular to the LED mounting plane.

25. The flex circuit of claim 24, wherein the dielectric layer comprises a polymer.

26. The flex circuit of claim 24, wherein the thermal pathway comprises a thermally conductive material.

27. The flex circuit of claim 26, wherein the thermal pathway comprises copper.

28. The flex circuit of claim 26, wherein the thermal pathway has a length approximately equal to the thickness of the substrate and heat spreader layer.

29. The flex circuit of claim 26, wherein the thermal pathway has a length approximately equal to the thickness of the heat spreader layer.

30. The circuit assembly of claim 1, which comprises a component of an LCD display.

31. The circuit assembly of claim 18, which comprises a component of an LCD display.

32. The flex circuit of claim 24, which comprises a component of an LCD display.

33. The circuit assembly of claim 1, wherein the thermal pathway comprises a thermal via.

34. The circuit assembly of claim 18, wherein the thermal pathway comprises a thermal via.

35. The flex circuit of claim 24, wherein the thermal pathway comprises a thermal via.

36. The circuit assembly of claim 1, wherein the thermal pathway has a length at least equal to the thickness of the substrate and heat spreader layer.

* * * * *